United States Patent
Richter et al.

(10) Patent No.: US 7,767,593 B2
(45) Date of Patent: **\*Aug. 3, 2010**

(54) SEMICONDUCTOR DEVICE INCLUDING FIELD EFFECT TRANSISTORS LATERALLY ENCLOSED BY INTERLAYER DIELECTRIC MATERIAL HAVING INCREASED INTRINSIC STRESS

(75) Inventors: Ralf Richter, Dresden (DE); Carsten Peters, Dresden (DE); Juergen Boemmels, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 168 days.

This patent is subject to a terminal disclaimer.

(21) Appl. No.: 12/044,049

(22) Filed: Mar. 7, 2008

(65) Prior Publication Data
US 2009/0061645 A1 Mar. 5, 2009

(30) Foreign Application Priority Data
Aug. 31, 2007 (DE) ........................ 10 2007 041 220

(51) Int. Cl.
*H01L 21/469* (2006.01)
(52) U.S. Cl. ...................................... 438/783; 257/369
(58) Field of Classification Search ................. 438/783; 257/369
See application file for complete search history.

(56) References Cited

U.S. PATENT DOCUMENTS

| 6,169,040 | B1 * | 1/2001 | Mifuji et al. | 438/763 |
|---|---|---|---|---|
| 6,391,777 | B1 * | 5/2002 | Chen et al. | 438/687 |
| 7,078,333 | B2 * | 7/2006 | Goh et al. | 438/622 |
| 2005/0042860 | A1 * | 2/2005 | Daniels et al. | 438/637 |
| 2006/0046400 | A1 * | 3/2006 | Burbach et al. | 438/282 |
| 2006/0246672 | A1 | 11/2006 | Chen et al. | 438/301 |
| 2006/0286758 | A1 * | 12/2006 | Liang et al. | 438/305 |
| 2007/0187727 | A1 * | 8/2007 | Ting et al. | 257/274 |
| 2009/0108363 | A1 * | 4/2009 | Forbes et al. | 257/368 |

FOREIGN PATENT DOCUMENTS

DE 10 2004 057 762 A1 8/2006

OTHER PUBLICATIONS

May 29, 2008 correspondence from foreign associate forwarding Official Communication.
Translation of Official Communication Issued Apr. 24, 2008.

* cited by examiner

*Primary Examiner*—N Drew Richards
*Assistant Examiner*—Yu-hsi Sun
(74) *Attorney, Agent, or Firm*—Williams, Morgan & Amerson, P.C.

(57) ABSTRACT

By appropriately treating an interlayer dielectric material above P-channel transistors, the compressive stress may be significantly enhanced, which may be accomplished by expanding the interlayer dielectric material, for instance, by providing a certain amount of oxidizable species and performing an oxidation process.

22 Claims, 6 Drawing Sheets

SEMICONDUCTOR DEVICE INCLUDING FIELD EFFECT TRANSISTORS LATERALLY ENCLOSED BY INTERLAYER DIELECTRIC MATERIAL HAVING INCREASED INTRINSIC STRESS

BACKGROUND OF THE INVENTION

1. Field of the Invention

Generally, the present disclosure relates to the field of integrated circuits, and, more particularly, to the manufacture of P-channel field effect transistors having a strained channel region caused by a stressed dielectric material formed around the transistors.

2. Description of the Related Art

Integrated circuits typically comprise a large number of circuit elements on a given chip area according to a specified circuit layout, wherein, in complex circuits, the field effect transistor represents one important device component. Generally, a plurality of process technologies are currently practiced, wherein, for complex circuitry based on field effect transistors, such as microprocessors, storage chips and the like, MOS technology is currently one of the most promising approaches due to the superior characteristics in view of operating speed and/or power consumption and/or cost efficiency. During the fabrication of complex integrated circuits using MOS technology, millions of transistors, in CMOS technology, complementary transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, the conductivity of the channel region represents an important factor that substantially affects the performance of the MOS transistors. Thus, the reduction of the channel length, and associated therewith the reduction of the channel resistivity, may be dominant design criteria for accomplishing an increase in the operating speed of integrated circuits.

The shrinkage of the transistor dimensions, however, involves a plurality of issues associated therewith that have to be addressed so as to not unduly offset the advantages obtained by steadily decreasing the channel length of MOS transistors. One problem in this respect is the reduction of the thickness of the gate dielectric layer in order to maintain the desired channel controllability on the basis of increased capacitive coupling. With the thickness of oxide-based gate dielectrics approaching 1.5 nm and less, the further scaling of the channel length may be difficult due to an unacceptable increase of leakage currents through the gate dielectric. For this reason, it has been proposed to enhance device performance of the transistor elements not only by reducing the transistor dimensions but also by increasing the charge carrier mobility in the channel region for a given channel length. One efficient approach is the modification of the lattice structure in the channel region, for instance, by creating tensile or compressive strain therein, which results in a modified mobility for electrons and holes, respectively. For example, creating tensile strain in the channel region of a silicon layer having a standard crystallographic configuration may increase the mobility of electrons, which in turn may directly translate into a corresponding increase in the conductivity for N-type transistors. On the other hand, compressive strain in the channel region may increase the mobility of holes, thereby providing the potential for enhancing the performance of P-type transistors. Consequently, it has been proposed to introduce, for instance, a silicon/germanium layer or a silicon/carbon layer in or near the channel region to create tensile or compressive stress. Although the transistor performance may be considerably enhanced by the introduction of strain-creating layers in or below the channel region, significant efforts have to be made to implement the formation of corresponding strain-inducing layers into the conventional and well-approved CMOS technique. For instance, additional epitaxial growth techniques have to be developed and implemented into the process flow to form the germanium- or carbon-containing stress layers at appropriate locations in or below the channel region. Hence, process complexity is significantly increased, thereby also increasing production costs and the potential for a reduction in production yield.

Therefore, a technique is frequently used that enables the creation of desired stress conditions within the channel region of different transistor elements by modifying the stress characteristics of a contact etch stop layer that is formed above the basic transistor structure in order to form contact openings to the gate and drain and source terminals in an interlayer dielectric material. The effective control of mechanical stress in the channel region, i.e., an effective stress engineering, may be accomplished by individually adjusting the internal stress in the contact etch stop layers located above the respective transistor elements so as to position a contact etch stop layer having an internal compressive stress above a P-channel transistor while positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition (PECVD) processes above the transistor, i.e., above the gate structure and the drain and source regions, wherein, for instance, silicon nitride may be used due to its high etch selectivity with respect to silicon dioxide, which is a well-established interlayer dielectric material. Furthermore, PECVD silicon nitride may be deposited with a high intrinsic stress, for example, up to 2 Giga Pascal (GPa) or significantly higher of tensile or compressive stress, wherein the type and the magnitude of the intrinsic stress may be efficiently adjusted by selecting appropriate deposition parameters. For example, ion bombardment, deposition pressure, substrate temperature, the type of gas components and the like represent suitable parameters that may be used for obtaining the desired intrinsic stress. Since the contact etch stop layer is positioned close to the transistor, the intrinsic stress may be efficiently transferred into the channel region, thereby significantly improving the performance thereof. Moreover, for advanced applications, the strain-inducing contact etch stop layer may be efficiently combined with other strain-inducing mechanisms, such as strained or relaxed semiconductor materials that are incorporated at appropriate transistor areas in order to also create a desired strain in the channel region. Consequently, the stressed contact etch stop layer is a well-established design feature for advanced semiconductor devices. The amount of the intrinsic stress may, however, be restricted due to process-specific limitations. Therefore, the thickness of the respective etch stop layers is typically increased, which also results in an increase of the respective strain in the channel region. For example, the effective compressive force and thus the corresponding strain in P-channel transistors may be efficiently raised by increasing the thickness of the contact etch stop layer. The layer thickness may, however, have to be adapted to the requirements of the subsequent contact etch stop layer, which typically demands a moderately low thickness of several hundred nano-meters and less, in particular for sophisticated devices comprising dense patterns, at which the conformal behavior of the etch stop layer may no longer be maintained. Thus, although the provision of a highly stressed etch stop material above P-channel transistors represents an efficient approach for enhancing drive current and switching speed, the achievable gain in performance may be restricted by the deposition characteristics for and the thickness of the contact etch stop layer.

The present disclosure is directed to various techniques and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein is directed to methods and devices for obtaining enhanced strain-inducing mechanisms to order to increase charge carrier mobility in channel regions of field effect transistors on the basis of stressed dielectric materials formed in contact with the transistor elements. For this purpose, the interlayer dielectric material provided in combination with an etch stop material above the respective transistor elements and separating the transistors from the first metallization level may be used for enhanced stress engineering so as to at least significantly increase the performance of one type of transistor. To this end, additionally or alternatively to the contact etch stop layer, which are typically provided with high intrinsic stress, the interlayer dielectric material may be provided with an appropriate intrinsic stress level that in turn creates an appropriate type of strain in the channel region of one transistor type. Thus, in some aspects, by providing a portion of the actual interlayer dielectric material in the vicinity of a specific transistor type, limitations of conventional stress engineering approaches on the basis of stressed contact etch stop layers may be extended to a certain degree, since the deposition of the highly stressed contact etch stop layers may typically be performed on the basis of pattern-specific constraints in highly sophisticated applications while the additional stressed material of the interlayer dielectric nevertheless enables further stress enhancement. For instance, a highly stressed material which may also act as a contact etch stop layer may be deposited on the basis of process parameters so as to provide a highly conformal deposition regime, thereby enhancing process robustness and reliability, while a portion of the interlayer dielectric material may be provided on the basis of a deposition technique of increased gap-filling capabilities, thereby filling the spaces between adjacent gate electrodes of transistors. In order to obtain a high degree of additional stress in the interlayer dielectric material, an appropriate treatment may be performed to increase the volume of the material as deposited, thereby exerting an increased stress on the transistors, which will result in an increased strain in the channel regions. Therefore, in particular for P-channel transistors, an enhanced compressive strain level may be obtained in the channel regions, thereby significantly contributing to performance enhancement of these transistors.

One illustrative method disclosed herein comprises forming a first stress-inducing dielectric layer above a plurality of P-channel transistors, wherein the first stress-inducing layer creates a first type of strain in the plurality of P-channel transistors. The method further comprises forming a second stress-inducing dielectric layer above an N-channel transistor, wherein the first and second stress-inducing layers create a second type of strain in the N-channel transistor, and wherein the second type of strain differs from the first type of strain. Additionally, the method comprises forming an interlayer material above the first and second dielectric stress-inducing layers and selectively increasing a volume of the interlayer material above the plurality of P-channel transistors.

A further illustrative method disclosed herein comprises forming a first stress-inducing layer above a first plurality of adjacent transistors, wherein the first stress-inducing layer generates a compressive strain in the first plurality of transistors. Furthermore, a spacing between the adjacent transistors is filled by an interlayer material and a compressive stress is generated in the interlayer material after filling the spacing so as to induce strain in the first plurality of adjacent transistors.

Another illustrative method disclosed herein comprises forming a compressive dielectric layer selectively above a first device region that includes a first transistor. The method further comprises forming a tensile dielectric layer selectively above a second device region that includes a second transistor. Moreover, a first interlayer dielectric material is deposited above the compressive dielectric layer and the tensile dielectric layer. A portion of the first interlayer dielectric material is removed from above the second device region and compressive stress is generated in the first interlayer dielectric material. Finally, a second interlayer dielectric material is formed above the second device region and the first interlayer dielectric material.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the subject matter disclosed herein relates to a technique for providing a strain-inducing mechanism on the basis of stressed dielectric materials formed above respective transistor elements, wherein the efficiency of at least a compressive stress source may be enhanced by appropriately forming an interlayer dielectric material with a high intrinsic stress level for adjusting the respective strain in the transistor elements enclosed by the highly stressed interlayer dielectric material. For this purpose, an appropriate material may be provided, for instance, after the deposition of respective contact etch stop layers, which may also be provided with high intrinsic stress, and by subsequently treating the material to increase the volume thereof, which may result in an additional compressive strain component, which may increase the performance of P-channel transistors. In some illustrative aspects disclosed herein, the increase of the volume of an interlayer material may be accomplished on the basis of a heat treatment so as to, for instance, oxidize an appropriate species contained in the interlayer material, which may finally result in a corresponding expansion of the material. For example, upon oxidizing silicon, a significant increase of the initial volume may be obtained, since silicon dioxide has a greater volume compared to the silicon consumed during the oxidation process. In other examples, any other appropriate species, such as germanium and the like, may be incorporated into a basic dielectric material to provide the desired increase of volume upon a corresponding oxidation process. By incorporating an appropriate species, such as silicon, germanium and the like, into a basically dielectric interlayer material, the generally insulating behavior of this material may be reliably ensured, irrespective of the degree of oxidation of the correspondingly incorporated oxidizable species. In still another illustrative method, the interlayer material may be provided in the form of an oxidizable material, which may have a certain basic conductivity, such as silicon, germanium and the like, which may be subsequently treated at moderately low temperatures to convert the inter-layer material into a dielectric material while also providing the desired increase in volume. In some illustrative embodiments, well-established deposition techniques, such as PECVD processes, may be used for forming a highly stressed interlayer dielectric material on the basis of silicon dioxide in order to obtain a high compressive basic stress, which may be even further enhanced by incorporating a respective species and performing a subsequent treatment, such as oxidation, which may result in an even further enhanced stress level of the previously deposited material. For example, silicon dioxide, which may represent a widely-used interlayer dielectric material, may be formed on the basis of a thermal chemical vapor deposition (CVD) process using TEOS as a pre-cursor material, thereby providing a deposition process having excellent gap-filling capabilities, wherein a high degree of conformality or, if required, a substantially "flow-like" fill behavior may be achieved depending on the process parameters selected. The respective thermal deposition process may be performed at significantly higher pressures compared to, for instance, plasma-enhanced deposition techniques in the range of approximately 200-760 Torr, wherein a corresponding process is frequently denoted as a "sub-atmospheric" CVD (SACVD) process. After depositing the well-established interlayer dielectric material to a desired height level, a respective expansion of the volume thereof may be performed to obtain the desired increased compressive stress, wherein patterning of the interlayer dielectric material may be performed prior to or after a corresponding treatment for increasing the volume. Consequently, in this case, well-established process techniques may be used, while nevertheless providing enhanced stress levels in P-channel transistor devices.

Figure 1A:
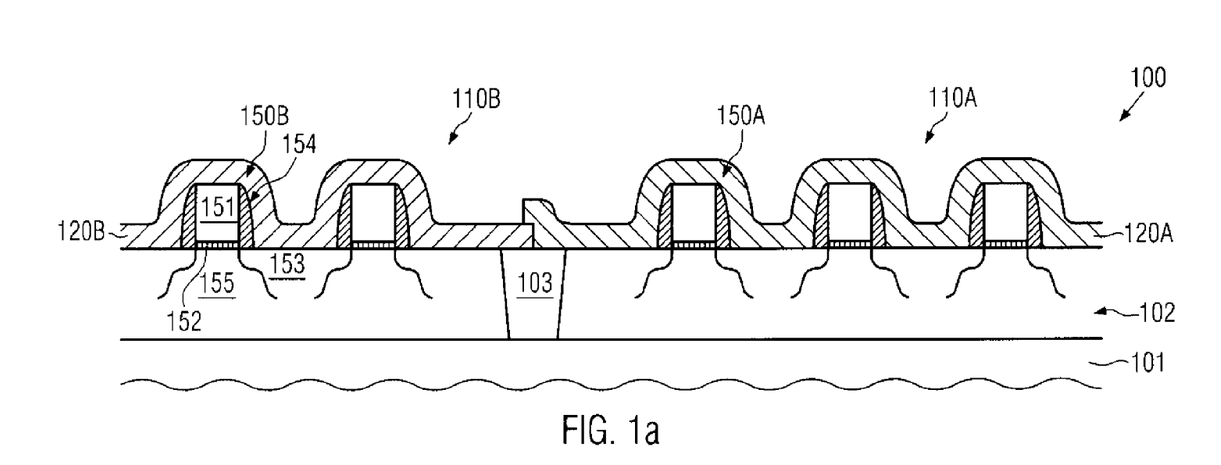
FIGS. 1a-1c schematically illustrate cross-sectional views of a semiconductor device including transistors of different conductivity type during various manufacturing stages, wherein the strain level in one type of transistors may be increased by selectively increasing the volume of an interlayer dielectric material according to illustrative embodiments.

FIG. 1*a* schematically illustrates a cross-sectional view of a semiconductor device 100, which may comprise a first device region 110B including one or more first transistors 150B and a second device region 110A including one or more second transistor devices 150A. The first and second transistors 150B, 150A may differ in their configuration so as to require different types of strain in respective channel regions for enhancing the performance of the transistors, i.e., for increasing the drive current and the switching speed of the transistors. For example, the one or more first transistors 150B may represent N-channel transistors requiring a tensile strain for a specified crystallographic orientation, i.e., for a (100) surface orientation, with a channel length direction oriented along the <110> direction. On the other hand, the one or more second transistors 150A may represent P-channel transistors requiring a compressive strain in the corresponding channel regions. The transistors 150A, 150B may differ in their configuration with respect to doping profiles, type of doping species used, transistor dimensions and the like. For convenience, any such differences are not shown and described herein.

The semiconductor device 100 may further comprise a substrate 101, which may represent any appropriate carrier material, such as a semiconductor bulk substrate, a silicon-on-insulator (SOI) type substrate and the like. For example, the substrate 101 may represent a bulk silicon substrate having formed thereon an appropriate semiconductor layer 102, such as a silicon-based material, the characteristics of which may be locally adjusted with respect to its charge carrier mobility by inducing a corresponding strain in specified portions of the semiconductor layer 102. In other cases, the substrate 101 may have formed thereon a buried insulating layer (not shown), on which may be formed the semiconductor layer 102 so as to provide an SOI architecture. Furthermore, the semiconductor layer 102 may comprise an isolation structure 103, such as a shallow trench isolation, in order to separate the first device region 110B from the second device region 110A. Moreover, each of the transistors 150A, 150B may comprise a gate electrode structure 151 which may be comprised of any appropriate material, such as polysilicon, metal-containing materials or any combinations thereof, wherein a sidewall spacer structure 154 may be formed on sidewalls of the gate electrode structure 151. Moreover, a gate insulation layer 152, which may be comprised of silicon dioxide based materials, high-k dielectric materials and the like, separates the gate electrode structure 151 from a channel region 155, which is laterally enclosed by respective drain and source regions 153. It should be appreciated that the sidewall spacer structure 154 may also have been removed at this manufacturing stage and may in general have a plurality of individual spacer elements which may be separated by respective liner materials (not shown) in order to provide respective controllability of etch processes during the patterning of the spacer structure 154. In other cases, the spacer structure 154 may be reduced to a certain degree in order to reduce the width dimensions and/or the height dimensions thereof, depending on the process strategy, thereby also enhancing the stress transfer mechanism. Furthermore, one or both types of transistors 150A, 150B may comprise additional strain-inducing sources, such as strained semiconductor materials and the like. For example, the transistors 150A, when representing P-channel transistors, may have incorporated therein a strained silicon/germanium material, thereby creating additional strain in the respective channel region 155. Similarly, an appropriate strain-inducing mechanism may be provided in the transistors 150B, while, in other illustrative embodiments, the respective strain in the channel regions 155 may be substantially determined on the basis of dielectric material to be formed above the first and second transistors 150A, 150B.

In the manufacturing stage shown, the device 100 may comprise a first dielectric layer 120B, which may represent a contact etch stop layer, wherein, in some illustrative embodiments, the first dielectric layer 120B may also act as a stress-inducing layer for enhancing the strain in the channel regions 155 of the first transistors 150B. For example, the layer 120B may comprise any appropriate material having a high etch selectivity with respect to an interlayer dielectric material still to be formed, wherein a respective thickness of the layer 120B as well as the type and amount of intrinsic stress may be selected so as to obtain a desired degree of conformality and the desired etch stop characteristics. For example, the layer 120B may have a high tensile stress in the range of 1 GPa or significantly higher, depending on the device requirements. For instance, the first dielectric layer 120B may be comprised of silicon nitride, which may be directly formed on the respective transistor areas, i.e., the drain and source regions 153 and the gate electrode 151, or on respective metal silicide regions or other metal-containing regions (not shown), while in other illustrative embodiments, an additional liner material (not shown) may be provided when respective patterning regimes for providing the etch stop layers of different intrinsic stress above the first and second device regions 110B, 110A may require the provision of respective liner materials.

Similarly, a second dielectric layer 120A, such as a second contact etch stop layer, may be formed above the second device region 110A and may have, in one illustrative embodiment, a high compressive stress appropriate for enhancing the performance of the transistors 150A provided as P-channel transistors. For example, the dielectric layer 120A may be provided with high compressive stress in the range of 2 GPa or significantly higher. The second layer 120A may be comprised of silicon nitride, nitrogen-enriched silicon carbide and the like.

The semiconductor device 100 as shown in FIG. 1a may be formed according to the following processes. After providing the substrate 101 having formed thereon the semiconductor layer 102, the isolation structures may be formed in order to define the first and second device regions 110B, 110A. Thereafter, an appropriate vertical dopant profile may be established, for instance, as required for P-channel transistors and N-channel transistors. Next, the gate electrodes 151 and the gate insulation layers 152 may be formed on the basis of sophisticated oxidation and/or deposition techniques followed by advanced photolithography processes and highly sophisticated etch techniques for patterning the gate electrodes 151 and the gate insulation layers 152. Subsequently, the spacer structure 154 may be formed with dimensions as required for profiling the lateral dopant concentration for the drain and source regions 153 on the basis of sophisticated ion implantation techniques and/or diffusion processes, epitaxial growth techniques and the like. After having incorporated the required doping concentrations, appropriate anneal processes may be performed at any appropriate manufacturing stage to activate the dopants and re-crystallize implantation-induced lattice damage. Furthermore, respective silicidation processes may be performed if a reduction of the resistance of the contact portions of the transistors 150A, 150B is required. Thereafter, the dielectric layers 120A, 120B may be formed on the basis of appropriate deposition techniques, such as PECVD, wherein the process parameters may be appropriately selected to create the desired type and magnitude of intrinsic stress. For example, the first layer 120B may be deposited above the first and second device regions 110B, 110A and may be selectively removed from above the second device region 110A on the basis of photolithography and corresponding etch techniques. Thereafter, the second dielectric layer 120A may be deposited and may be subsequently patterned on the basis of a lithography process, wherein respective etch stop materials (not shown) or etch indicator materials may be provided prior to the deposition of the second layer 120A so as to enhance the control of the respective etch process.

Figure 1B:
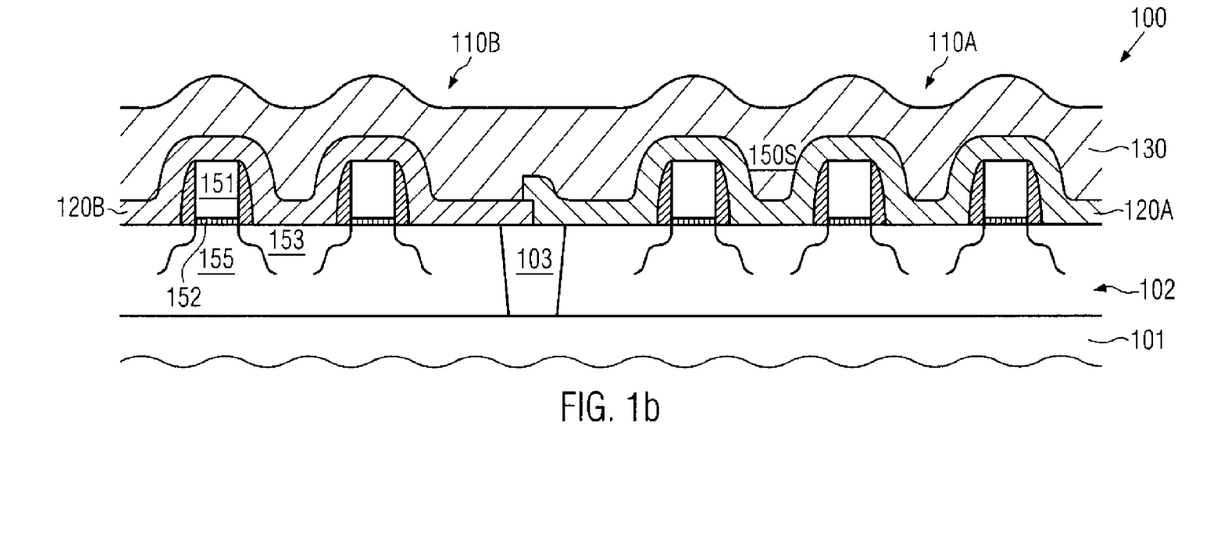

FIG. 1b schematically illustrates the semiconductor device 100 in a further advanced manufacturing stage, wherein an interlayer material 130 is formed above the first and second device regions 110B, 110A. The interlayer material 130 may, in some illustrative embodiments, represent a dielectric material, the characteristics of which may be subsequently modified to obtain an increase of volume in the second device region 110A. For example, the interlayer material 130 may be provided in the form of a silicon dioxide material, which may be formed on the basis of any appropriate deposition technique, such as SACVD, as previously explained. Due to the superior gap filling capabilities of a corresponding deposition process, the interlayer material 130 may reliably fill any spaces 150S between adjacent gate electrodes of the transistors 150A, 150B. In other illustrative embodiments, the interlayer material 130 may be comprised of an appropriate material, which may be treated in a subsequent process to act as a substantially dielectric material and to provide the desired expansion to exert the desired type of strain in the second device region 110A. For instance, the interlayer material 130 may be provided in the form of a basic dielectric material having incorporated therein an increased amount of oxidizable material, as will be described later on in more detail. After the deposition of the interlayer material 130, which may result in a pronounced surface topography, depending on the deposition parameters, in some illustrative embodiments, material may be removed to planarize the surface topography, which may be accomplished on the basis of etch techniques, chemical mechanical polishing (CMP) or any combination thereof For example, an appropriate material may be deposited in a highly non-conformal manner, thereby providing a substantially planar surface topography, and thereafter the additional material and the interlayer material 130 may be subjected to an etch process which may result in an appropriate reduced height level, for instance, by exposing the first and second layer 120B, 120A above the respective gate electrodes 151. In other cases, a CMP process may be performed wherein the first and second etch stop layers 120B, 120A may be used as CMP stop layers. Thereafter, in some illustrative embodiments, the remaining interlayer material 130 may be treated to incorporate an appropriate species, such as an oxidizable material, for instance, in the form of silicon, germanium and the like, which may be accomplished by an ion implantation process on the basis of appropriate implantation parameters. For this purpose, simulation calculations or other empirical data may be used to determine an average penetration depth for a specified species, such as silicon, thereby obtaining appropriate process parameters with respect to implantation energy to incorporate the desired species into the material 130, while substantially avoiding a significant implantation-induced damage in horizontal portions of the first and second dielectric layers 120B, 120A. In this manner, an undesired relaxation of an internal stress of these layers may be substantially avoided.

Thereafter, the interlayer material 130 may be patterned to remove the material from above the first device region 110B, which may be accomplished on the basis of photolithography and etch techniques, wherein the layer 120B may act as an efficient etch stop layer. In still other illustrative embodiments, the patterning of the interlayer material 130 may be performed prior to incorporating a respective species, wherein the incorporation may be accomplished by using an additional resist mask to cover the first device region 110B, thereby avoiding implantation-induced damage in the first dielectric layer 120B. On the other hand, the process parameters of the implantation process may be selected such that implantation-induced relaxation in the second dielectric layer 120A may be maintained at a low level, as previously explained. It should be appreciated that, due to an additional efficient strain-inducing mechanism, a minor stress relaxation in the second dielectric layer 120A may be acceptable. In still other illustrative embodiments, the respective incorporation of an oxidizable species or any other volume increasing species may be accomplished on the basis of a resist mask that covers the first device region 110B, while the interlayer material 130 is still in its non-patterned state, so that the subsequent treating of the interlayer material 130 may result in a desired volume increase above the second device region 120A, while maintaining the material 130 above the first device region 110B substantially in its initial state due to the lack of any oxidizable or volume increasing species in this portion.

Figure 1C:
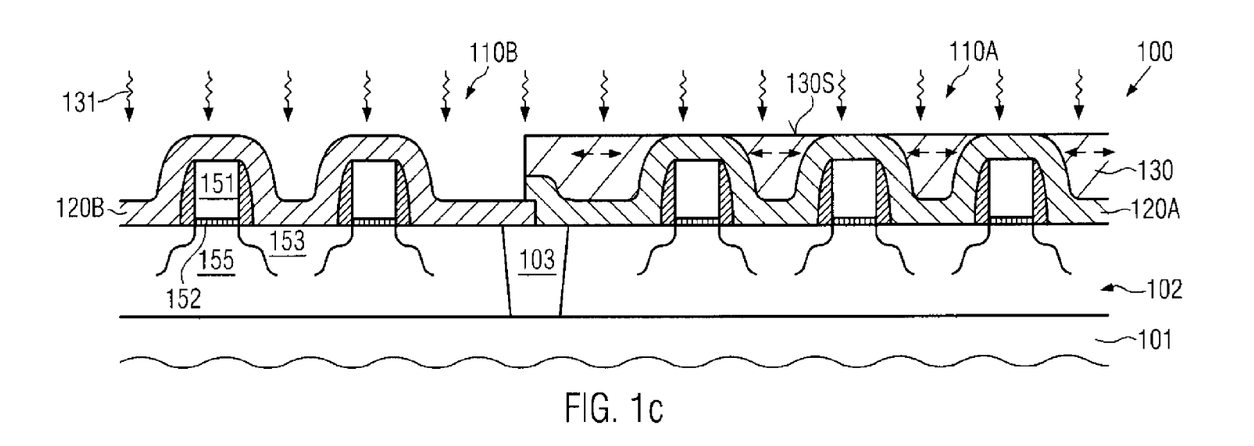

FIG. 1c schematically illustrates the semiconductor device 100 in a further advanced manufacturing stage, wherein the device 100 is exposed to a treatment 131 for generating a compressive stress in the material 130 above the second device region 110A. In the embodiment shown, it may be assumed that the interlayer material 130 may have been patterned prior to the treatment 131, while, in other illustrative embodiments, as previously explained and as will also be shown later on, the interlayer material 130 may be subjected to the treatment 131 in a non-patterned state wherein, depending on the process requirements, a planarization of the surface 130S may have been performed. In one illustrative embodiment, the treatment 131 may comprise a heat treatment at elevated temperatures, for instance, in the range of 400-500° C. in an oxidizing ambient, such as a plasma-based ambient and the like, thereby initiating oxygen diffusion into the material 130, which may then react with any oxidizable species contained therein, such as silicon, germanium and the like. In other cases, a volume increasing species may be incorporated by a preceding process, such as during the deposition of the material 130, which may result in increase upon exposure to heat, radiation and the like. For example, highly volatile substances may be incorporated, as are also used for forming pours in low-k dielectrics, which may induce compressive strain in the material 130 after energy deposition caused by the treatment 131. Consequently, an increase of volume and thus an expansion of the material 130 may be accomplished, thereby exerting the desired type of stress on the transistors 150A. In some illustrative embodiments, the inter-layer material 130 may comprise, at least partially, a substantially completely oxidizable material composition, for instance, in the form of polysilicon and the like, which may then result in a significant increase of volume during the treatment 131. For this purpose, the interlayer material 130 may be deposited in the form of any appropriate material, such as a polysilicon material, which may be treated, for instance, in the form of a plasma oxidation ambient, to convert the polysilicon material into a silicon dioxide, thereby creating a dielectric material having a high degree of intrinsic compressive stress.

After the treatment 131, which in some illustrative embodiments may be followed by a patterning of the interlayer material 130, when the treatment 131 has been performed on the basis of the substantially non-patterned layer 130, the further processing may be continued by depositing an interlayer dielectric material, such as silicon dioxide, on the basis of well-established process techniques. Thereafter, any contact openings may be formed through the interlayer dielectric material, wherein the first and second layers 120B, 120A may act as efficient etch stop layers in accordance with well-established process strategies.

Figure 1D:
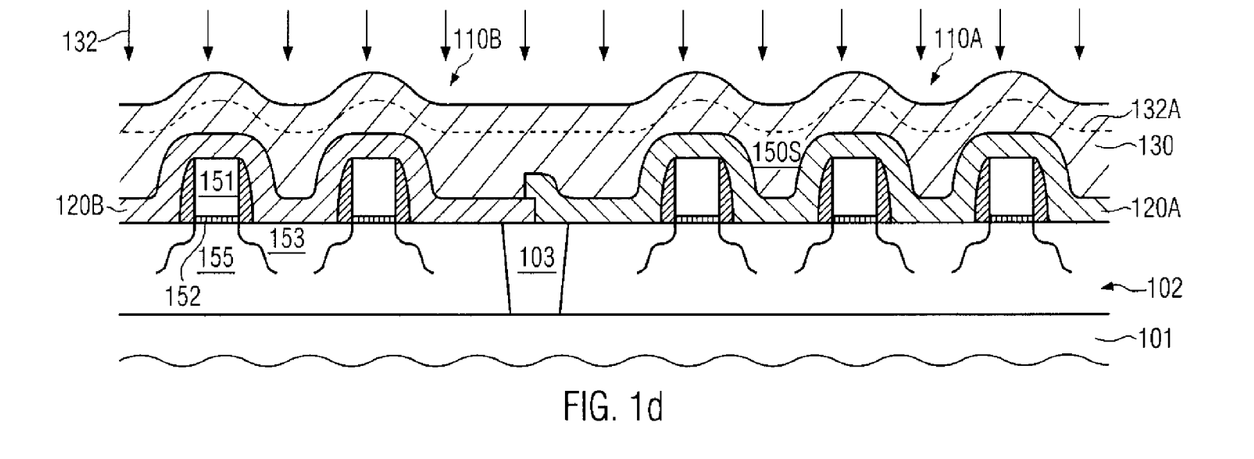
FIGS. 1d-1e schematically illustrate cross-sectional views of the semiconductor device according to further illustrative embodiments, in which an appropriate species may be incorporated into an interlayer dielectric material on the basis of ion implantation with a subsequent treatment for expanding the interlayer dielectric material.

FIG. 1d schematically illustrates a cross-sectional view of the semiconductor device 100 according to further illustrative embodiments, wherein, starting from the device configuration as shown in FIG. 1*b*, an ion implantation process 132 may be performed to incorporate a desired species 132A into the interlayer material 130 without providing a respective implantation mask, thereby reducing the overall process complexity. That is, after the deposition of the interlayer material 130, the implantation process 132 may be performed without a lithography mask, wherein the respective process parameters, i.e., implantation energy and dose for the specific species under consideration 132A may be selected to position a desired concentration in particular within the spaces 150S. In this case, the pronounced surface topography may provide similar implantation conditions adjacent to and above respective gate electrodes 151 of the transistors 150B, 150A, wherein the corresponding overlying material of the layer 130 may act as an implantation mask. Consequently, implantation-induced damage within the first and second dielectric layers 120B, 120A, even above the respective gate electrodes 151, may be maintained at a lower level while not requiring a lithography process. Thereafter, the layer 130 may be planarized, for instance on the basis of etching, CMP and the like, as previously explained, followed by the treatment 131 or, in some illustrative embodiments, by a patterning process for removing the remaining material of the layer 130 from above the first device region 110B. The treatment 131 may then be performed on the basis of the patterned material layer 130, as, for example, shown in FIG. 1*c*.

Figure 1E:
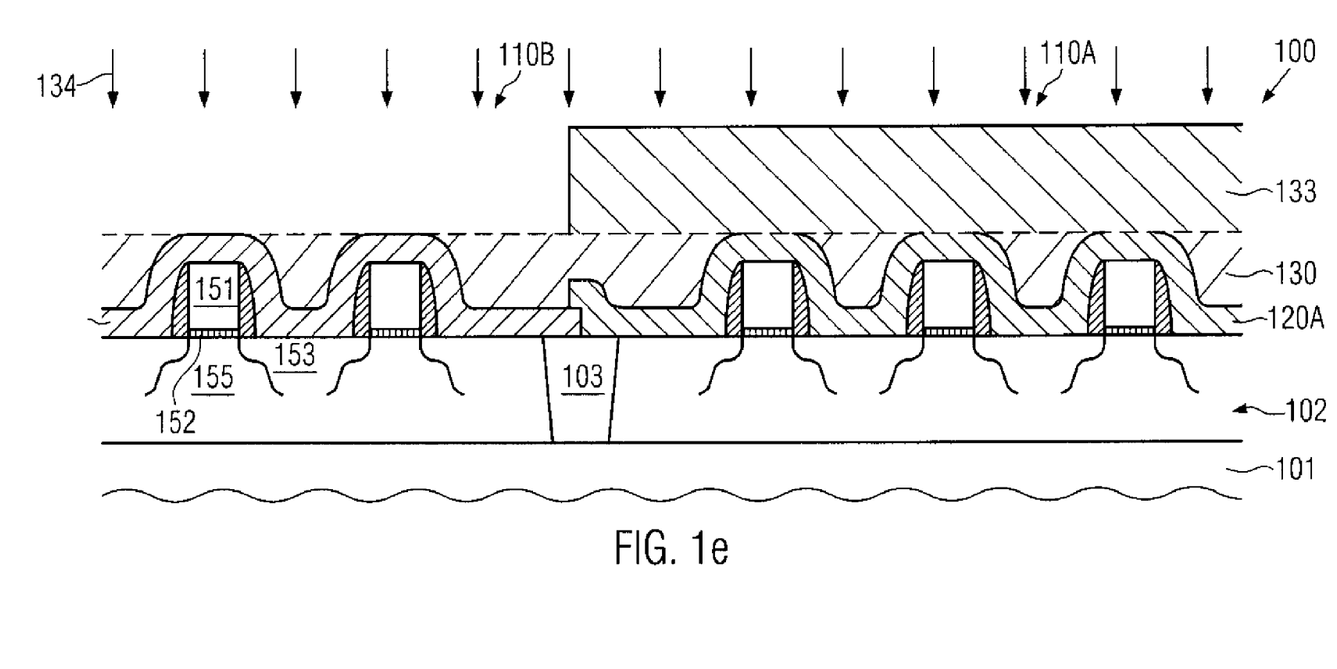

FIG. 1*e* schematically illustrates the semiconductor device 100 in an advanced manufacturing stage wherein, as discussed above, the interlayer material 130 may have a planarized surface topography while an appropriate oxidizable species, such as silicon, germanium or other materials, may have been incorporated during the implantation process 132. Furthermore, in the embodiment shown, a resist mask 133 may be provided which covers the second device region 110A, while exposing the first device region 110B. Furthermore, in the embodiment shown, the semiconductor device 100 may be exposed to an etch ambient 134 that is designed to selectively remove material of the layer 130 from above the first device region 110B, wherein the first dielectric layer 120B may act as an efficient etch stop layer. For example, if the material 130 is substantially comprised of silicon dioxide and the first dielectric layer 120A may be comprised of silicon nitride, highly selective well-established etch recipes are available and may be used during the process 134. Thereafter, the resist mask 133 may be removed by well-established techniques and the device 100 may be subjected to a corresponding treatment, such as the treatment 131, for instance in the form of an oxidation process using an oxidizing ambient, a plasma ambient and the like, thereby obtaining the desired expansion of the remaining portion of the material 130 above the second device region 110B. In other cases, the resist mask 133 may be formed after the treatment 131 so as to remove the highly stressed material layer 130 from above the first device region 110B, as also previously discussed.

Figure 1F:
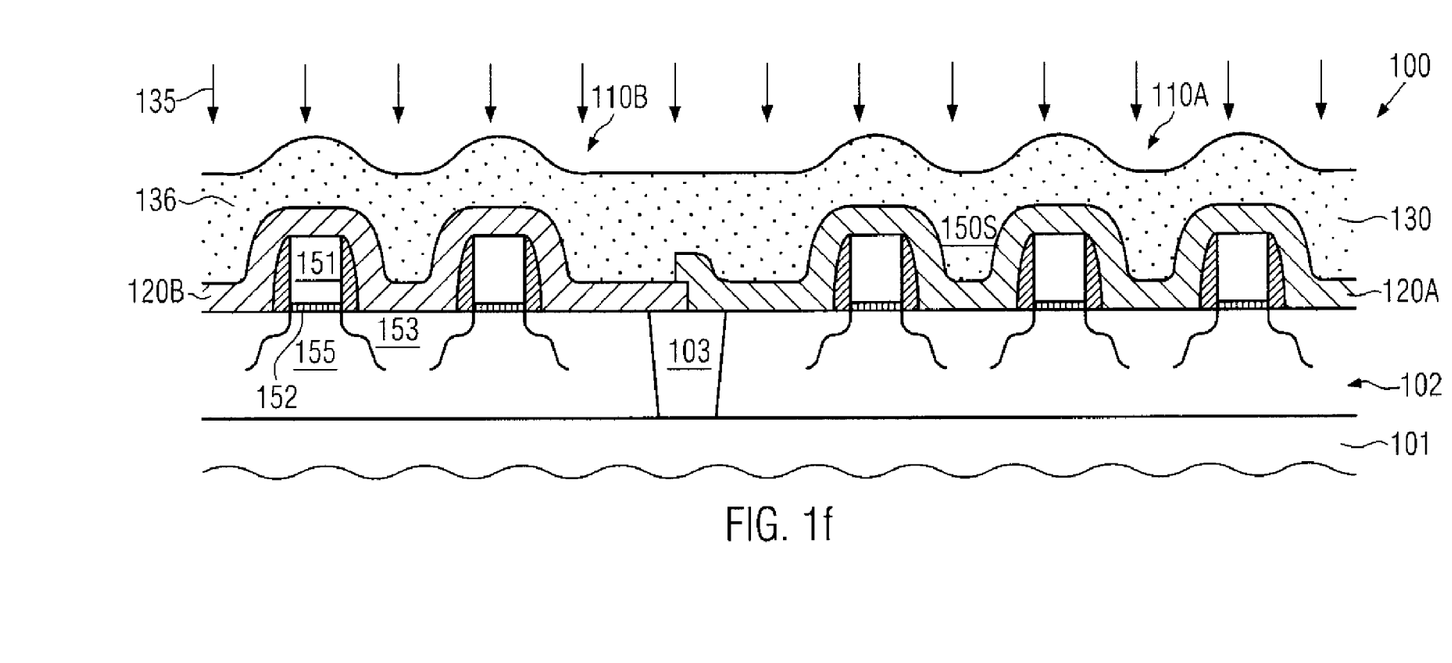
FIG. 1*f* schematically illustrates a cross-sectional view of the semiconductor device, in which an appropriate species, such as an oxidizable material, is incorporated during the deposition of a material, the volume of which is to be expanded in a subsequent process step according to still further illustrative embodiments.

FIG. 1*f* schematically illustrates the semiconductor device 100 according to further illustrative embodiments, wherein an appropriate species 136 for subsequently expanding the volume of the interlayer material 130 may be incorporated during a deposition process 135 for forming the interlayer material 130. For example, the deposition process 135 may be performed on the basis of deposition techniques that ensure a high degree of gap filling capability so as to reliably fill the spaces 150S between adjacent transistors. For example, the material 130 may be provided as a basic dielectric material, for instance in the form of silicon dioxide, for which well-established deposition techniques are available, as previously explained. During the deposition process, parameters may be varied, for instance the amount of silicon-containing precursor materials may be increased to shift the material composition of the material 130 such that silicon may be available for a subsequent oxidation process. In other illustrative embodiments, the species 136 may be provided in the form of other substances, such as germanium, which may also readily oxidize at moderately low temperatures, thereby providing the desired expansion of the basic layer 130. In still other illustrative embodiments, the interlayer material 130 may be provided as a per se oxidizable material, such as polysilicon, which may be oxidized at moderately low temperature on the basis of plasma ambient and the like. In some illustrative cases, the species 136 may be provided as a material that may be "activated" by energy deposition to increase the volume of the material 130 without undergoing a chemical bonding with the material 130, as previously discussed. In some illustrative embodiments, the interlayer material 130 may be deposited during the process 135 with a moderately low layer thickness and an intermediate treatment 131 may be performed to provide the desired expansion of the previously deposited material. Thereafter, a further layer of the material 130 may be deposited and a subsequent step of the treatment 131 may be performed. Thereafter, the resulting material 130 may be patterned, as previously described, thereby providing the enhanced compressive stress in the second device region 110B.

Figure 1G:
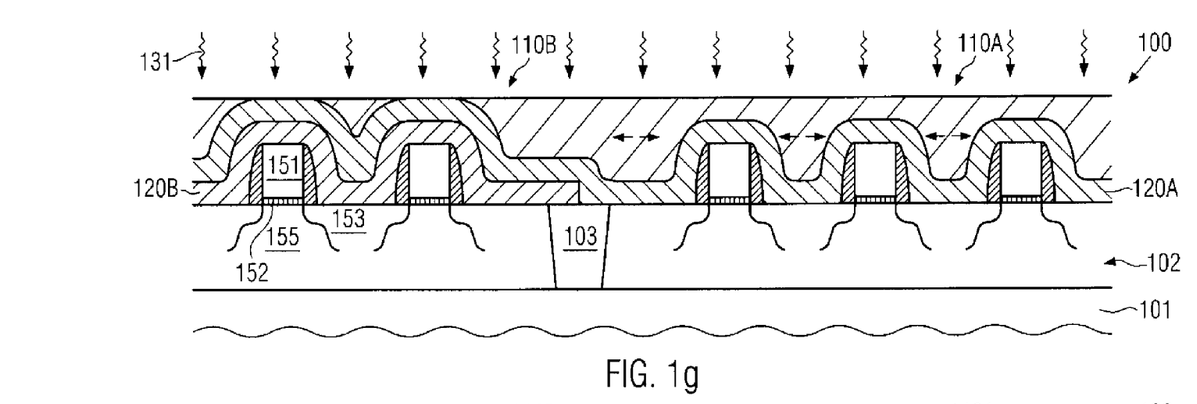
FIGS. 1*g*-1*i* schematically illustrate cross-sectional views of a semiconductor device during a selective volume increase of material acting as an interlayer dielectric material, wherein an enhanced patterning regime may be used on the basis of a single lithography process according to still further illustrative embodiments.
Figure 1H:
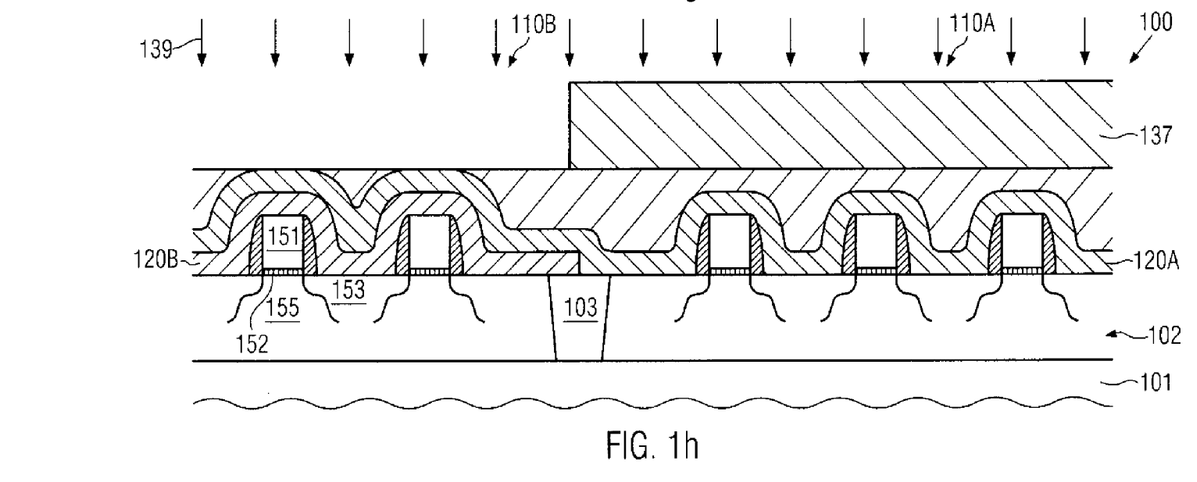
Figure 1I:
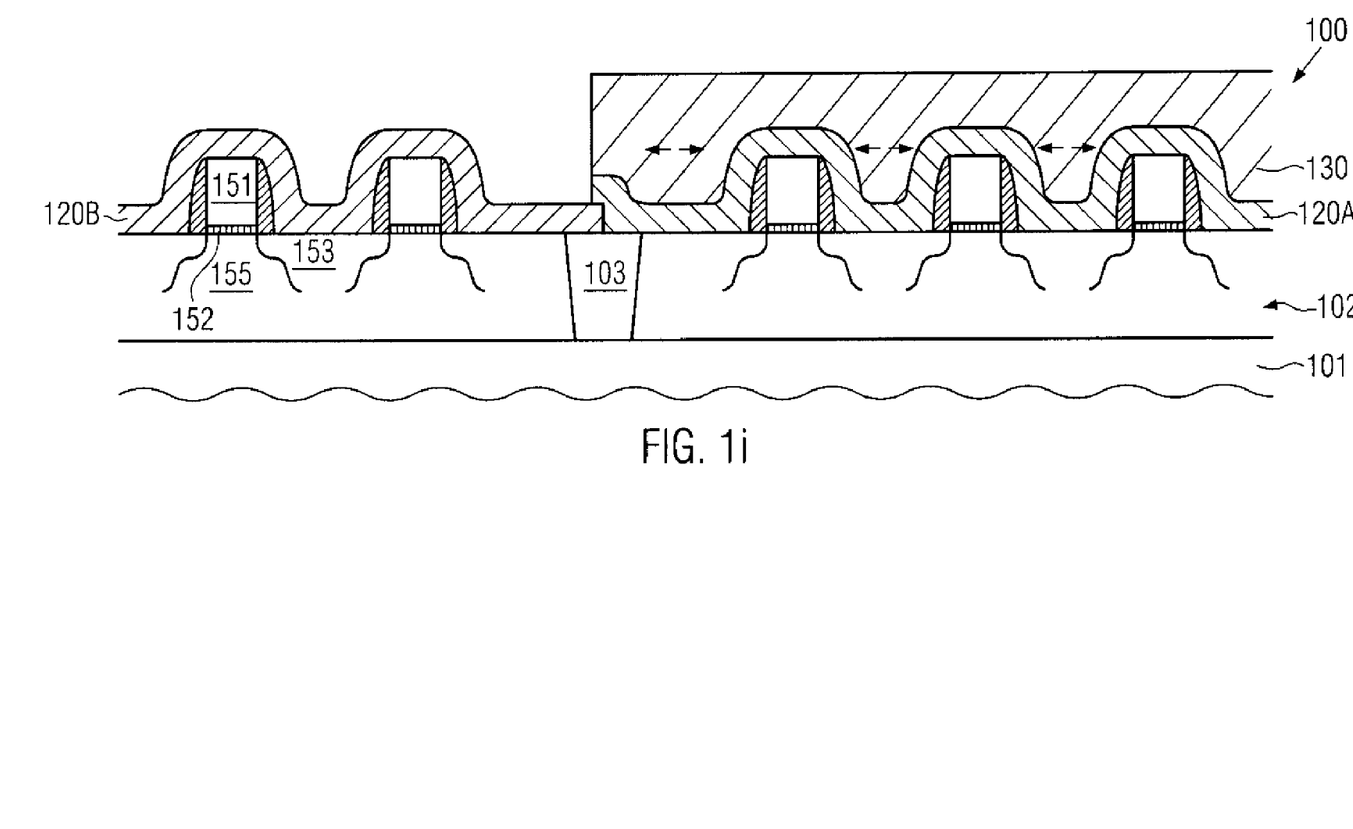

With reference to FIGS. 1*g*-1*i*, further illustrative embodiments will now be described in which the number of lithography steps for patterning the layer 130 may be reduced.

In FIG. 1*g*, the semiconductor device 100 is shown in a manufacturing stage in which the first dielectric layer 120B is patterned to cover the first device region 110B, while the second dielectric layer 120A is shown in a non-patterned state, i.e., the dielectric layer 120A is formed above the first and second device regions 110B, 110A. Moreover, the interlayer material 130 is formed above the first and second device regions 110B, 110A, wherein the surface of the layer 130 may have been planarized, for instance, on the basis of processes as previously described. Furthermore, an appropriate species, such as an oxidizable species, for instance in the form of silicon, germanium and the like, may have been incorporated into the material 130. For example, after planarizing the material layer 130, an ion implantation process may be performed wherein the second layer 120A above the first device region 110B may provide relaxed process margins since typically the penetration depth during implantation may be less for the layers 120A, 120B compared to the material 130. Consequently, during a respective ion implantation process, implantation-induced damage in the layer 120B may be significantly suppressed. In one illustrative embodiment, as shown, the treatment 131 may be performed prior to patterning the layer 130, as previously explained. For example, a corresponding oxidation process may be performed, thereby obtaining the desired expansion of the material of the layer 130. In other cases, the treatment 131 may be performed after the patterning, as previously described.

FIG. 1*h* schematically illustrates the semiconductor device 100 with an etch mask 137, such as a resist mask or any other mask, for exposing the first device region 110B while covering the second device region 110A. Moreover, the semiconductor device 100 is subjected to an etch process 139 designed to first remove the exposed portion of the layer 130 and subsequently remove the unwanted portion of the layer 120A above the first device region 110B. For example, during the etch process 139, selective etch techniques may be used as previously described so as to expose the layer 120A. Depending on process strategies, the mask 137 may be maintained and the etch chemistry may be appropriately changed to selectively remove the exposed portion of the layer 120A, wherein well-established process techniques may be used, as previously described with reference to the device as shown in FIG. 1a. In other illustrative embodiments, the mask 137, for instance provided in the form of a resist mask, may be removed after a first step of the etch process 139, and thereafter the patterned layer 130 may be used as a further etch mask for removing the exposed portion of the layer 120A. After the removal of the exposed portion of the interlayer material 130 and possibly after removal of the portion 120A, in some illustrative embodiments, the treatment 131 may be performed to generate the desired compressive stress in the second device region 110A.

FIG. 1i schematically illustrates the semiconductor device 100 after the completion of the above-described process sequence. Hence, the material 130 above the second device region 110A may include the high desired intrinsic stress, while the transistors in the first device region 110B have formed thereon the highly stressed layer 120B, which may not be substantially affected by the previous processes for increasing the volume of the layer 130, while nevertheless reducing the number of lithography steps required. That is, the patterning of the layer 130 and the patterning of the layer 120A may be performed on the basis of a single lithography step, thereby providing an enhanced stress transfer mechanism without adding to process complexity compared to conventional dual stress liner approaches.

As a result, the subject matter disclosed herein provides an efficient enhancement of conventional stress-inducing mechanisms by providing a dielectric material above device regions requiring a high compressive stress, which may be obtained by increasing the volume or expanding the material on the basis of appropriate treatments, such as incorporation of oxidizable materials, followed by an oxidation process and the like. Hence, the performance of P-channel transistors may be significantly improved, while, in some illustrative embodiments, additional lithography steps may be avoided, thereby enhancing device performance substantially without adding to overall process complexity.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first stress-inducing dielectric layer above a plurality of P-channel transistors, said first stress-inducing dielectric layer creating a first type of strain in said plurality of P-channel transistors;
    forming a second stress-inducing dielectric layer above an N-channel transistor, said first and second stress-inducing dielectric layers creating a second type of strain in said N-channel transistor, said second type of strain differing from said first type of strain;
    forming an interlayer material above said first and second stress-inducing dielectric layers;
    selectively increasing a volume of said interlayer material above said plurality of P-channel transistors; and
    forming a contact opening in said interlayer material above said plurality of P-channel transistors after selectively increasing the volume.

2. The method of claim 1, wherein selectively increasing the volume of said interlayer material comprises providing an oxidizable material in said interlayer material and performing a heat treatment in an oxidizing ambient.

3. The method of claim 2, wherein said interlayer material is comprised of silicon dioxide and said oxidizable material is excess silicon.

4. The method of claim 1, further comprising removing a portion of said interlayer material from above said N-channel transistor.

5. The method of claim 4, wherein said portion of the interlayer material is removed prior to increasing the volume of said interlayer material.

6. The method of claim 4, wherein said portion of the interlayer material is removed after increasing the volume of said interlayer material.

7. The method of claim 2, wherein providing said oxidizable material comprises implanting an oxidizable species into said interlayer material.

8. The method of claim 7, wherein said oxidizable material comprises at least one of silicon and germanium.

9. The method of claim 2, wherein forming said interlayer material comprises depositing said interlayer material while incorporating said oxidizable material.

10. The method of claim 1, further comprising removing excess material of said interlayer material so as to planarize a surface topography.

11. The method of claim 10, wherein the volume of the interlayer material is selectively increased by implanting a species prior to removing said excess material and by performing a heat treatment.

12. The method of claim 10, wherein the volume of the interlayer material is selectively increased by implanting a species after removing said excess material and by performing a heat treatment.

13. The method of claim 1 wherein forming said first and second stress-inducing dielectric layers comprises forming said second stress-inducing dielectric layer above said plurality of P-channel transistors and said N-channel transistor, removing a portion of said second stress-inducing dielectric layer from above said P-channel transistors, forming said first stress-inducing dielectric layer above said P-channel transistors and said N-channel transistor, forming said interlayer material above said first stress-inducing dielectric layer and removing a portion of said interlayer material and a portion of said first stress-inducing dielectric layer from above said N-channel transistor by using a common etch mask.

14. A method, comprising:
    forming a first stress-inducing layer above a first plurality of adjacent transistors, said first stress-inducing layer generating a compressive strain in said first plurality of transistors;
    filling a spacing between said adjacent transistors by an interlayer material;
    generating compressive stress in said interlayer material by selectively increasing a volume of said interlayer material after filling said spacing so as to induce strain in said first plurality of adjacent transistors; and
    forming a contact opening in said interlayer material after selectively increasing the volume.

15. The method of claim 14, wherein generating compressive stress in said interlayer material comprises incorporating a species into said interlayer material and performing a treatment to increase a volume of said material and converting said interlayer material in a dielectric material.

16. The method of claim 15, wherein said species is an oxidizable material.

17. The method of claim 15, wherein incorporating said species comprises implanting said species.

18. The method of claim 14, further comprising forming a second stress-inducing layer above a second plurality of transistors, said second stress-inducing layer generating a tensile strain in said second plurality of transistors, and removing said interlayer material from above said second plurality of transistors.

19. The method of claim 18, further comprising forming an interlayer dielectric material above said first and second stress-inducing layers and said compressive interlayer material.

20. A method, comprising:
 forming a compressive dielectric layer selectively above a first device region including a first transistor;
 forming a tensile dielectric layer selectively above a second device region including a second transistor;
 depositing a first interlayer dielectric material above said compressive dielectric layer and said tensile dielectric layer;
 removing a portion of said first interlayer dielectric material from above said second device region;
 generating compressive stress in said first interlayer dielectric material by selectively increasing volume of said first interlayer material;
 forming a second interlayer dielectric material above said second device region and said first interlayer dielectric material;
 and forming a contact opening in said first and second interlayer material above said second device region after selectively increasing the volume.

21. The method of claim 20, wherein said portion is removed prior to generating compressive stress in said first interlayer dielectric material.

22. The method of claim 20, wherein generating compressive stress comprises incorporating an oxidizable species into said first interlayer dielectric material and performing a heat treatment.

* * * * *